(12) United States Patent
Johnson

(10) Patent No.: US 6,632,575 B1
(45) Date of Patent: Oct. 14, 2003

(54) PRECISION FIDUCIAL

(75) Inventor: Mark S. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 09/654,107

(22) Filed: Aug. 31, 2000

(51) Int. Cl.$^7$ ................................. G03F 9/00
(52) U.S. Cl. ............................. 430/5; 430/22
(58) Field of Search ................. 430/5, 22, 30, 430/296, 322, 323, 324

(56) References Cited

U.S. PATENT DOCUMENTS

| | | | |
|---|---|---|---|
| 5,250,983 A | * 10/1993 | Yamamura | ............ 355/125 |
| 5,732,163 A | 3/1998 | Brandstetter et al. | |
| 5,760,893 A | 6/1998 | Raymond | |
| 5,798,565 A | 8/1998 | Atkins et al. | |
| 5,801,441 A | 9/1998 | DiStefano et al. | |
| 5,805,421 A | 9/1998 | Livengood et al. | |
| 5,810,926 A | 9/1998 | Evers | |
| 5,831,445 A | 11/1998 | Atkins et al. | |
| 5,857,049 A | 1/1999 | Beranek et al. | |
| 5,874,322 A | 2/1999 | Evers | |
| 5,894,218 A | 4/1999 | Farnworth et al. | |
| 5,903,353 A | 5/1999 | Raymond | |
| 5,903,662 A | 5/1999 | DeCarlo | |
| 5,942,805 A | 8/1999 | Winer et al. | |
| 5,955,877 A | 9/1999 | Farnworth et al. | |
| 5,981,975 A | 11/1999 | Imhoff | |
| 6,001,703 A | 12/1999 | Winer et al. | |

* cited by examiner

*Primary Examiner*—Mark F. Huff
*Assistant Examiner*—Saleha R. Mohamedulla
(74) *Attorney, Agent, or Firm*—Klarquist Sparkman, LLP

(57) ABSTRACT

A fiducial includes complementary patterns that are situated symmetrically about a common axis. The complementary patterns permit location of the common axis as an axis that is equidistant from the complementary patterns. The complementary patterns are displaced from the common axes by different distances so that the common axis is located using the complementary patterns nearest the common axis to accurately locate the common axis. The complementary patterns include etch-compensation features that permit the common axis to be accurately located even if an etch process defines the fiducial and the etch process exhibits a process error or variation such as underetching or overetching. The fiducial may be produced by transferring a fiducial pattern from a mask such as a photomask. The fiducial pattern may also be defined on the mask using a computer-aided design program.

9 Claims, 5 Drawing Sheets

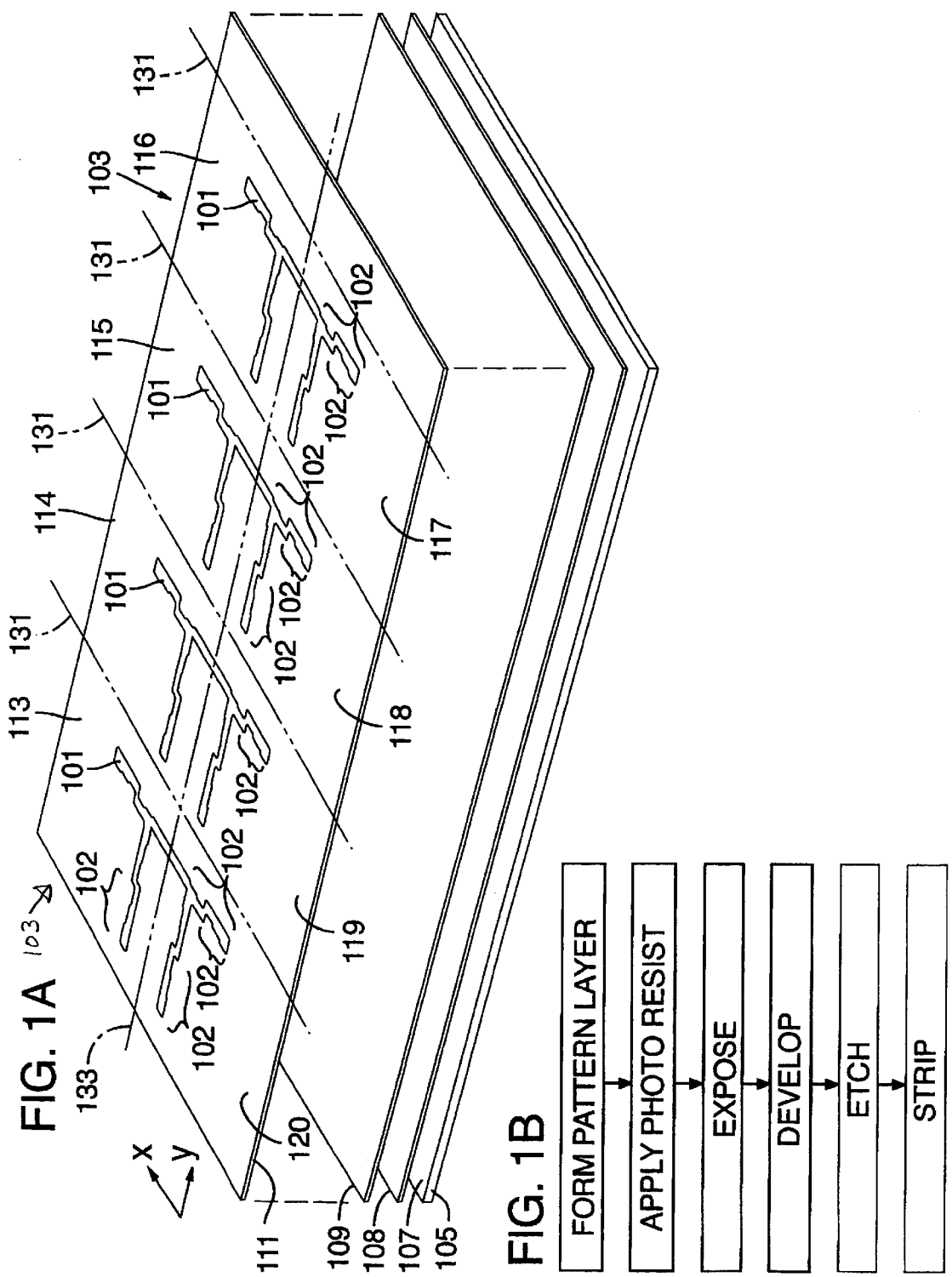

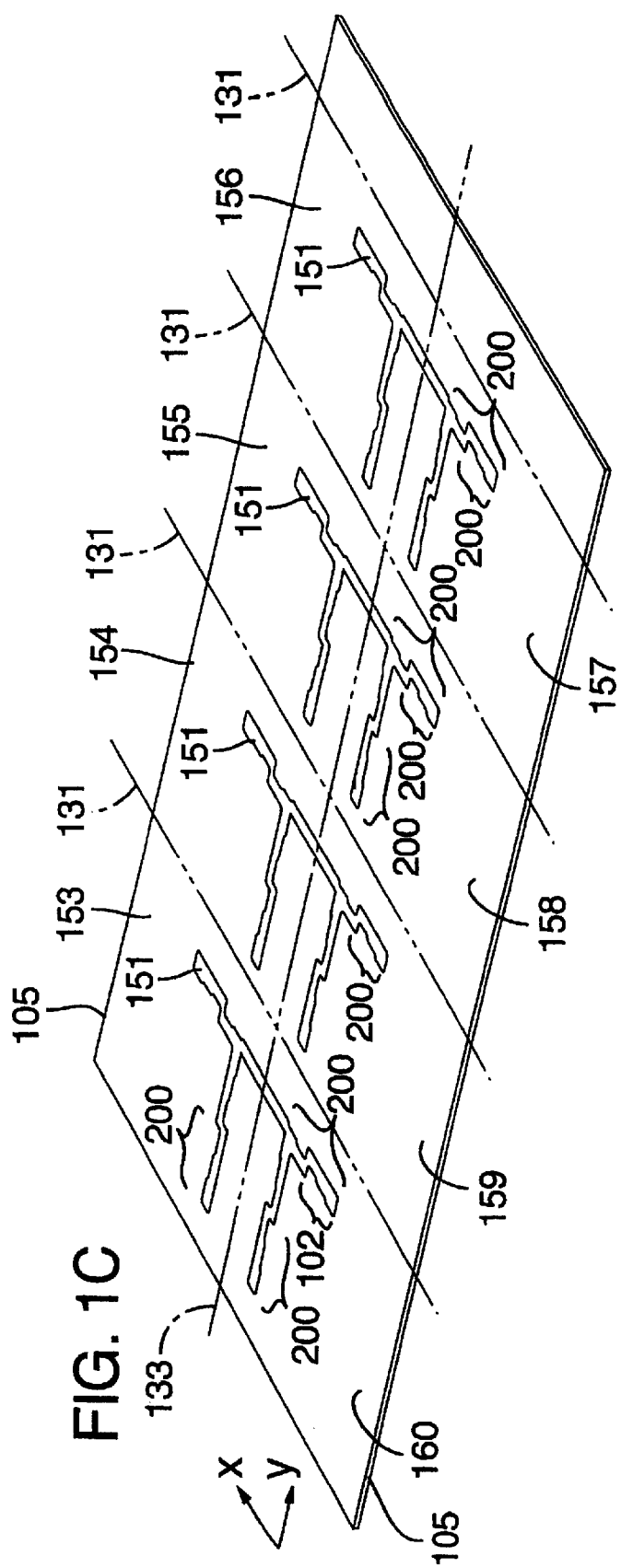

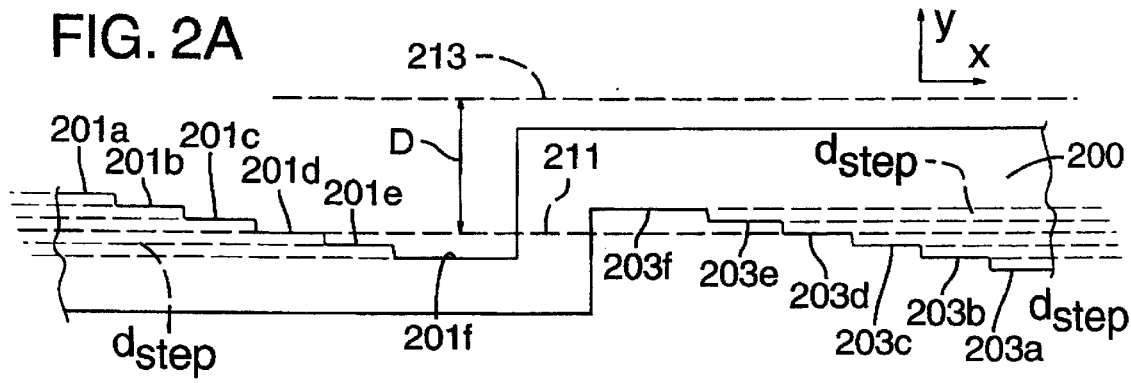
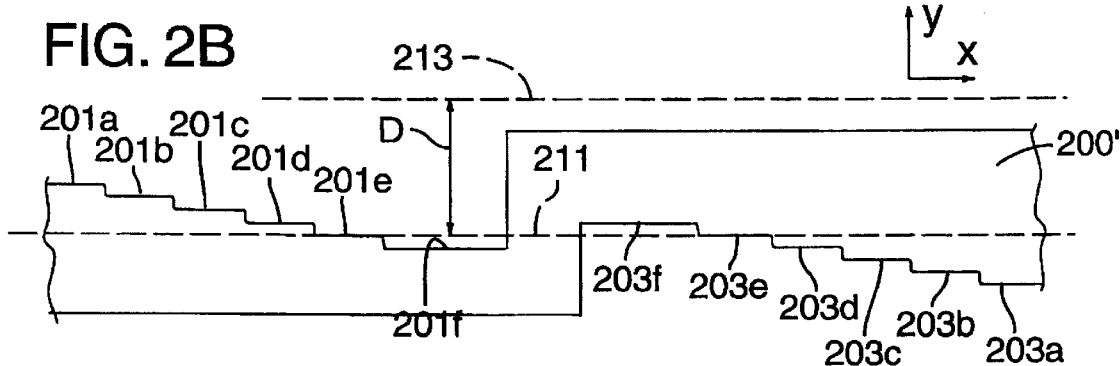
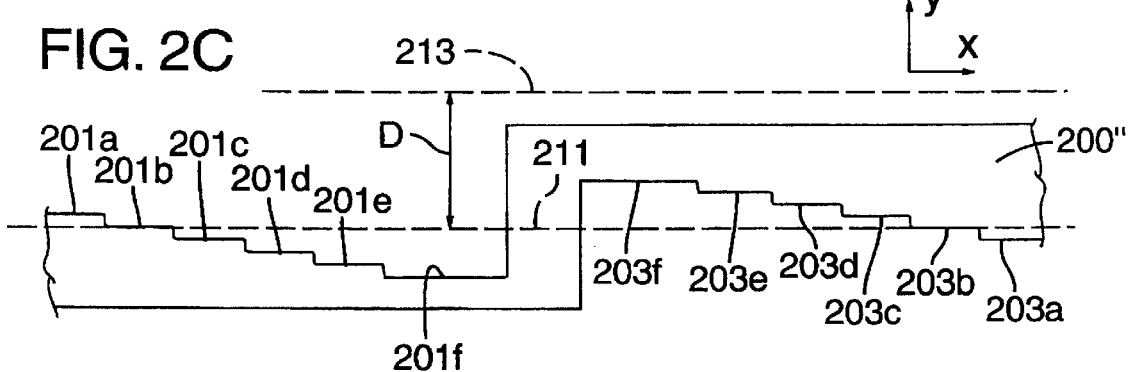
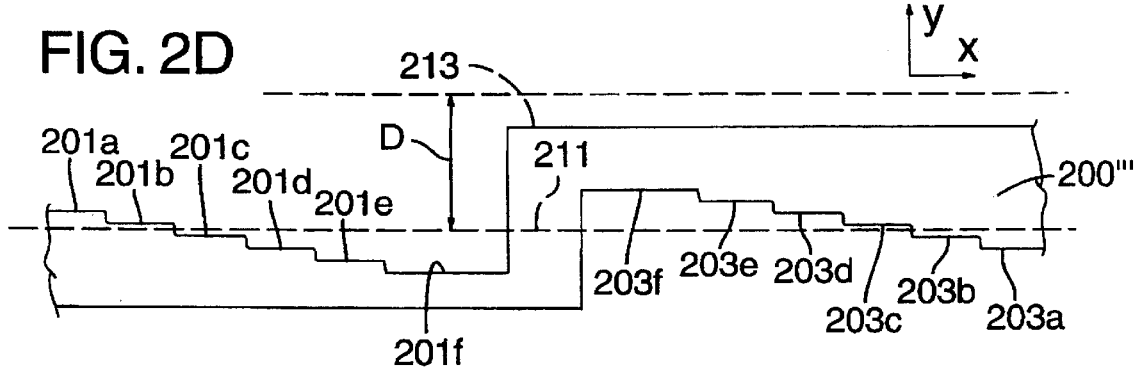

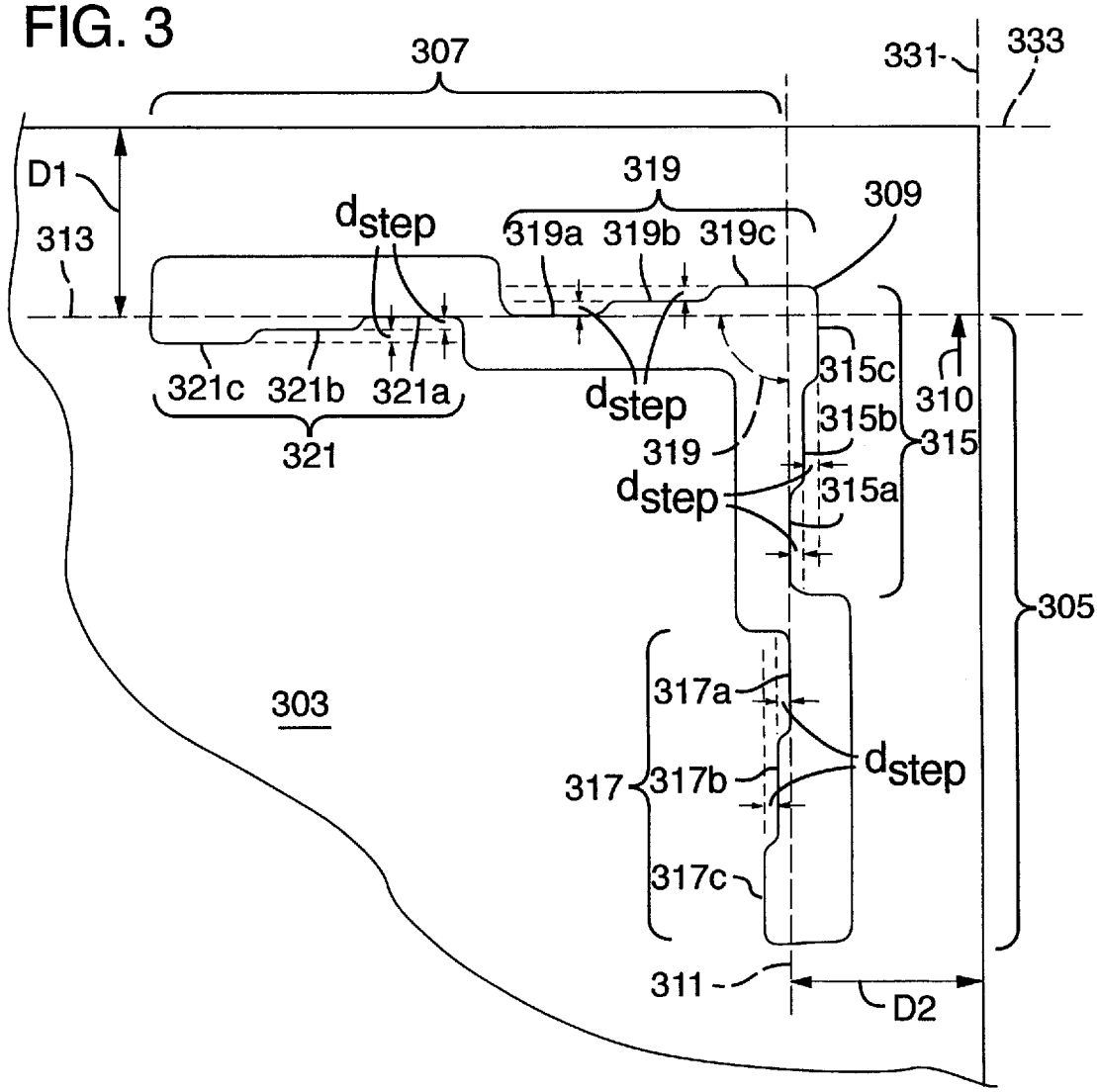

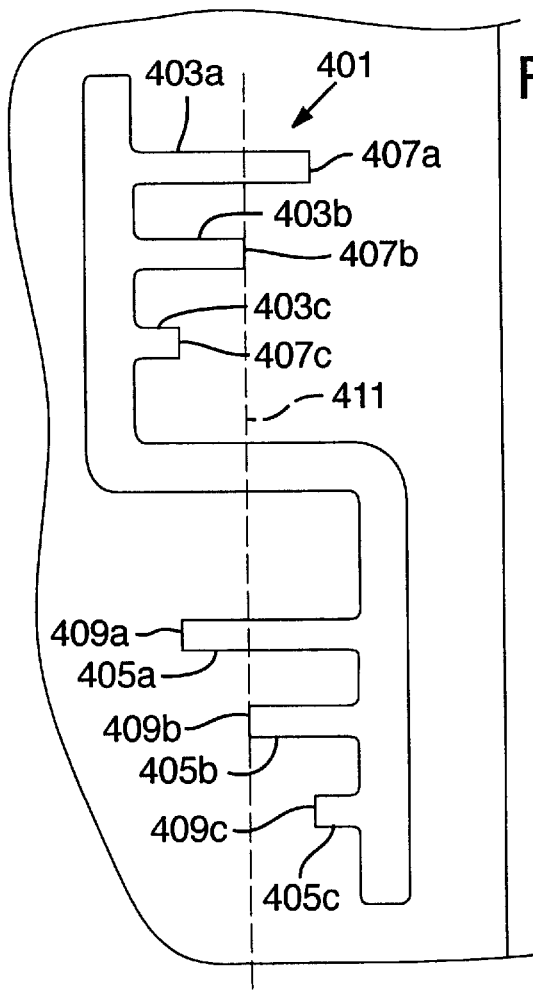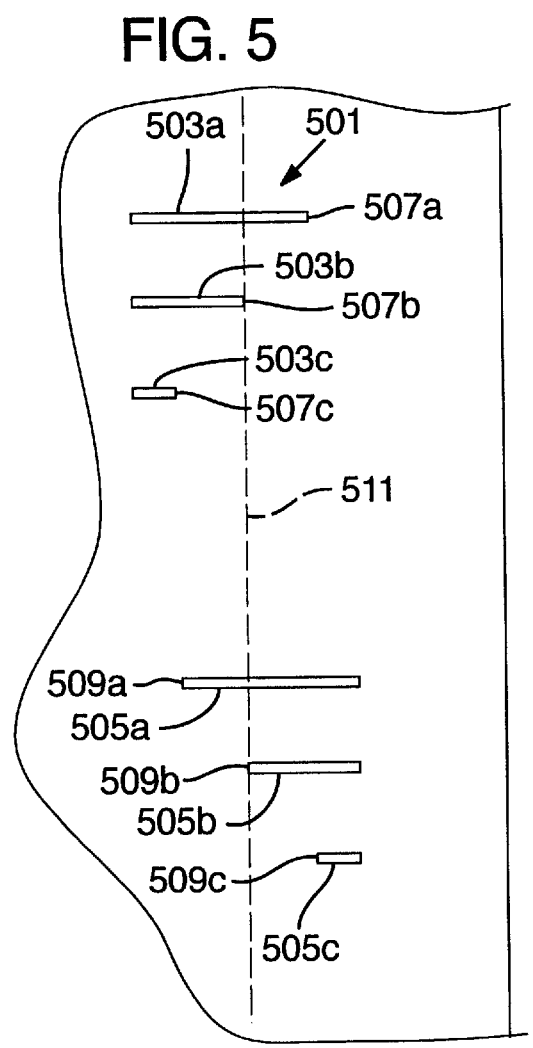

PRECISION FIDUCIAL

FIELD OF THE INVENTION

The invention pertains to alignment methods and alignment fiducials for the manufacture of circuits, integrated circuits, and circuit assemblies.

BACKGROUND OF THE INVENTION

The miniaturization of electronic circuits and circuit assemblies has increased the performance of electronic systems while reducing both system costs and system size. Miniaturization has been enabled by the development of fabrication methods for small circuit features as well as circuit assembly methods that permit close component placement. In addition, multilayer substrates have been developed that permit more compact interconnection of circuit components.

Many of the benefits of miniaturization are lost if fabrication yields or fabrication throughput decline significantly because of miniaturization. One problem that successful fabrication methods must solve is that of carrying out a sequence of independent operations on a circuit or a substrate in such a way that these independent operations are properly aligned with the circuit or circuit substrate, and are aligned with each other. For example, circuit elements mounted to a substrate in successive steps must be aligned with corresponding mounting pads on the substrate. Protective coatings must be dispensed onto components that are to be encapsulated ("potted") with a coating material without dispensing the coating material in areas that are to remain uncoated.

In one fabrication method, multiple circuits or circuit assemblies are fabricated on a single substrate to improve throughput and reduce manufacturing costs. When fabrication is complete, individual circuits or circuit assemblies are obtained by cutting the substrate. In order to cut the substrate without damaging individual circuits, a pattern can be transferred to the substrate and used to define cut lines. However, if the pattern that defines the cut lines is not accurately transferred to the substrate, the cut lines are not properly placed on the substrate and individual circuits can be damaged by cutting along such improperly placed cut lines. For example, in one method of defining cut lines, patterns defining the cut lines are formed on the substrate using an etching process. If the etching process removes too little or too much material, then the transferred pattern will not accurately place the cut lines.

For these reasons, improved alignment methods, apparatus, and alignment patterns are needed for the fabrication of circuits and circuit assemblies.

SUMMARY OF THE INVENTION

A mask for transferring patterns to a substrate includes a fiducial pattern that includes a first set and a second set of complementary features with each set typically including plural features. The sets of features may comprise respective first and second pairs of features. The first and second sets of features may define a common axis that is equidistant from the complementary features of both sets. This fiducial pattern is transferred from the mask to a substrate such as by using a photolithographic process such as contact or projection printing, or a charged-particle-beam lithographic process. According to a representative embodiment, the common axis is a distance $d_1$ from each of the complementary features of the first set or pair, and a distance $d_2$ from each of the complementary features of the second set or pair. In further embodiments, the distance $d_2$ is an integer multiple of the distance $d_1$. The complementary features of the fiducial pattern can be any of various pattern features, including edges and ends of lines.

Circuits are fabricated using this mask by transferring the fiducial pattern to a circuit substrate and using the transferred fiducial pattern (referred to herein as a "fiducial") to define an axis or other positional reference on the circuit substrate. The axis or other positional reference can be used in assembly or process steps, by defining an axis or axes along which the substrate is cut or otherwise divided, or defining a location at which components are inserted or other assembly operation is performed.

Substrates for circuits or circuit assemblies may include a fiducial that is defined by an etch process. The fiducial includes an etch compensation pattern that permits accurate determination of a substrate axis or location even if the etch process that defines the fiducial exhibits some process variation or error such as under- or over-etching. The fiducial includes an etch compensation portion that may define pairs of features such that each pair of features is equidistant from a common axis, but at different distances from the common axis. The common axis can be located by identifying the pair of features that are more nearly aligned, and defining the common axis with respect to this pair of features. In a representative embodiment, the pattern features are edges or ends of lines.

Etch gauges for determining an etch amount include a first pair and a second pair of features wherein the features of the first pair and of the second pair are equidistant from an axis.

A computer readable medium includes computer executable instructions for producing fiducial patterns on a mask or for directly writing such patterns on a substrate.

A method of aligning a substrate is provided that includes a step of defining a fiducial on the substrate, the fiducial including two or more sets of complementary features, each set of which may comprise respective feature pairs that define a first common axis. In a subsequent step, either the pair of features closer to the first common axis is selected and the first common axis is located as a line equidistant from the selected pair of features. In further embodiments, a line along which the substrate is cut is defined as a line parallel to the first common axis, and, in some examples, offset from the first common axis. In further embodiments, the method of aligning a substrate includes providing two or more pairs of complementary features that define a second common axis that intersects the first common axis.

In additional embodiments, a method of singulation is provided in which a substrate is provided with a fiducial that includes at two or more sets or pairs of complementary edges, line ends, or other features that define a common axis. The common axis is located as a line midway between corresponding feature pairs.

Fiducials are provided for defining cut lines singulation of a circuit substrate into multiple individual circuits. The fiducials include a first linear portion that has two or more sets or pairs of complementary edges that are placed symmetrically with respect to a first axis. Edges of the two pairs are placed a different distances from the first axis. The fiducials also include a second linear portion that has two or more pairs of complementary edges that are symmetrically placed with respect and at different distances from a second axis. The first axis and the second axis can be parallel or intersect.

These and other features and advantages of the invention are set forth below with reference to the accompanying drawings.

BRIEF DESCRIPTION OF THE DRAWINGS

FIG. 1A is a schematic view illustrating a process for transferring fiducial patterns from a photomask to a substrate.

FIG. 1B is a block diagram of the process of FIG. 1A.

FIG. 1C is a schematic view of the substrate of FIG. 1A illustrating fiducials on the substrate.

FIGS. 2A–2C are plan views of a section of the fiducials of FIG. 1C illustrating as properly etched, over-etched, and under-etched, respectively.

FIG. 2D is a plan view of an over-etched fiducial having complementary edges that are not situated on a line.

FIG. 3 is a plan view of an alternative embodiment of fiducials.

FIG. 4 is a plan view of an additional embodiment of a fiducial pattern.

FIG. 5 is a plan view of a fiducial pattern that includes complementary pairs of line ends.

DETAILED DESCRIPTION

In the manufacture of circuit boards, integrated circuits, and other circuits and circuit assemblies, multiple devices are conveniently fabricated on a single substrate, and the substrate is cut, diced, cleaved, or sawed to obtain the individual devices. This separation of individual devices formed on a single substrate is referred to herein as singulation. Typical singulation methods include dicing, sawing, cleaving, and other methods. The selection of a particular singulation method depends on the substrate on which the devices are fabricated as well as the precision required of the singulation process. The boundaries of individual devices should be well defined in order to properly separate individual devices.

In order to permit accurate singulation (or other fabrication steps), fiducial patterns are provided on a substrate. FIGS. 1A–1C illustrate the transfer of exemplary fiducial patterns 101 defined on a photomask 103 to a substrate 105 using a contact printing process to form corresponding fiducials 151 on the substrate. As used herein, a fiducial refers to any feature, collection of features, or pattern formed on a circuit, integrated circuit, substrate, component, or circuit board that serves to establish a positional reference for a subsequent assembly, mounting, or other fabrication operation including, for example, singulation, sawing, scribing, encapsulation, component insertion, or bonding. A fiducial is generally transferred to a substrate based on a fiducial pattern defined by a mask.

The substrate 105 may be a multilayer material that includes layers of conducting and insulating materials. Representative materials include insulating circuit board base materials such as polyimide, glass epoxy, and glass fiber layers, as well as conducting layers such as copper, and solder resist layers. Alternatively, the substrate 105 may be a semiconductor wafer such as a silicon or gallium arsenide wafer, or a surface acoustic wave or integrated optic material such as lithium niobate, lithium tantalate, or quartz. In addition, the substrate 105 can include circuit components or patterns, or be without circuit components and patterns. For example, substrates include circuit boards and wafers prior to any assembly or processing as well as circuit boards and assemblies that are partially processed.

As shown in FIGS. 1A–1D, the substrate 105 is covered by a pattern layer 108 situated on a surface 107 of the substrate 105. The pattern layer 108 can, for example, be a metallic layer such as a copper layer, or layer of other material suitable for defining fiducials or other features on the substrate 105. The surface 107 of the substrate 105 may be partially or completely coated or otherwise layered with a photosensitive material 109 (i.e., a photoresist). Spin coating or other coating methods, for example, may be used. FIGS. 1A–1C illustrate pattern transfer using optical lithography with a photomask, but charged-particle-beam pattern-transfer can also be used.

The photomask 103 in this example comprises a, transparent plate 111 made of, for example, fused silica or glass, on which a reflective or absorptive coating is included or deposited. The fiducial patterns 101 are defined as patterns in this coating, typically using a computer-aided design (CAD) program that is stored on a computer, such as a personal computer or a workstation, as a set of computer readable instructions. Alternatively, the fiducial patterns can be directly written on or applied to the substrate 105, without using a mask.

Each of the exemplary fiducial patterns 101 of FIG. 1A includes pattern portions 102 that extend along an x-axis or a y-axis. Photomasks such as the photomask 103 can be prepared to precisely define the fiducial patterns 101 (as well as other patterns to be transferred), and pattern-transfer errors resulting from errors in the photomask 103 can generally be avoided. Other steps in the pattern transfer process, such as substrate exposure and etching processes are more likely to produce pattern-transfer errors.

The fiducial patterns 101 and any additional patterns defined by the photomask 103 are transferred to the substrate 105 by contact printing, or any of various methods of pattern-transfer including projection printing. To transfer the fiducial patterns 101 in a contact printing process, the photomask 103 is placed close to or in contact with the photosensitive coating 109 and the photomask is illuminated to expose the photosensitive coating 109. After exposure, the photosensitive coating 109 is developed, so that exposed or unexposed regions of the photosensitive coating 109 are removed, depending on whether the photosensitive coating 109 is a so-called positive or negative photoresist. After removal of portions of the photosensitive coating 109, corresponding portions of the pattern layer 108 are exposed.

An etch process may then be used to define fiducials in the pattern layer 108 by exposing the pattern layer 108 to any of various etches, including wet etches, dry etches, laser assisted etches, plasma etches, or other etching methods. During etching, unexposed portions of the pattern layer 108 remain protected by the photosensitive coating 109 and are not etched. After etching is complete, any remaining photoresist can be removed or "stripped" from the substrate 105.

As shown in FIG. 1A, the photomask 103 includes regions 113–120 that define features for individual circuits or circuit assemblies and that are conveniently processed as a group. The regions are separated by boundary lines 131, 133 that extend along the x-axis and y-axis, respectively. The photomask 103 typically does not include pattern features corresponding to the boundary lines 131, 133 at the locations of the boundary line. Instead, the fiducial patterns 101 define the boundary lines 131, 133. After fabrication of the substrate 105 is complete, individual circuit assemblies are separated from the substrate 105 by sawing, dicing, or other singulation methods.

FIG. 1C illustrates one embodiment of fiducials 151 on the substrate 105 after pattern transfer as described above.

The illustrated fiducials 151 define individual circuit assemblies 153–160, corresponding to pattern areas 113–120 on the photomask 103. Each of the fiducials 151 includes compensation patterns 200 that correspond to the pattern portions 102 defined by the photomask 103.

FIG. 2A is a plan view of a representative one of the compensation patterns 200 of FIG. 1C. The compensation pattern 200 extends along an x-axis and includes edges 201a–201f and 203a–203f. The edges 201a–201f and 203a–203f are parallel to the x-axis but are offset from each other by a compensation step distance $d_{step}$ or desirably an integer multiple thereof. The edges 201a–201f, 203a–203f are paired to form sets or pairs (201a, 203a), (201b, 203b), (203c, 203c), (201d, 203d), (201e, 203e), and (201f, 203f) of complementary edges. As used herein, pattern features such as edges are referred to as "complementary" if situated to define an axis that is equidistant from the pattern features. While the offsets of the edges 201a–201f and 203a–203f are conveniently selected as multiples of a common distance ($d_{step}$), other offsets can be used. The sets in this example include features which are mirror images of one another.

As shown in FIG. 2A, the complementary edges 201d, 203d define an axis 211 as well as a singulation line 213 that is parallel to and offset from the axis 211 a distance D in the y-direction. As the substrate 105 is processed, a process technician views the complementary edges 201d, 203d to determine locations for process operations such sawing or dicing. If the substrate 105 and the fiducials 151 are small, the technician can locate the axis 211 by viewing the pattern 151 with a microscope or a video camera and may align the substrate 105 for process operations by aligning a reticle axis with the complementary edges 201d, 203d.

Because of process variations in transferring the fiducial patterns 101 to the substrate 105, the complementary edges 201d, 203d do not always line up and an assembly technician may be unable to locate the axis 211 visually using the edges 201d, 203d. A common process error includes (or a process tolerance may permit) some underetching or overetching of the pattern layer 108, so that underetched or overetched fiducials are produced. FIG. 2B shows an exemplary fiducial pattern that includes an underetched compensation pattern 200'. The edges 201d, 203d do not define an axis. The edge 201d is aligned with the edge 203f and is not used to define the axis 211. However, complementary edges 201e, 203e are aligned and can be used to define the axis 211. If the compensation pattern 200 exhibits additional underetching, edges 201f, 203f may end up aligned and define the axis 211. FIG. 2C illustrates an overetched compensation pattern 200" in which the complementary edges 201b, 203b define the axis 211.

With reference to FIG. 2D, a compensation pattern 200''' exhibits overetching but none of the complementary pairs of edges align. The axis 211 can be located as the line parallel to and. equidistant from the most nearly aligned complementary pair of edges. As shown in FIG. 2D, the complementary pairs of edges (201b, 203b) or (201c, 203c) are most nearly aligned and serve to define the axis 211. Other complementary pairs can be used but typically locating the axis 211 midway between pairs of complementary edges requires some interpolation, estimation, or "eyeballing" by the assembly technician and it is preferable to reduce the total distance to be divided in order to reduce the magnitude of any error introduced. However, any of the complementary pairs can serve to define the axis 211 by locating a line equidistant between the complementary lines.

The compensation patterns 200 of FIGS. 2A–2D include plural complementary edges, in this case five pairs of such edges, but fewer pairs or additional pairs of complementary edges can be provided to compensate for less or more etch variation in forming the fiducials 151.

In addition, FIGS. 2A–2D illustrate defining an axis 211 that is parallel to an x-axis. Additional compensation patterns 200 serve to define an axis that is orthogonal to the axis 211 (see FIG. 1C). In additional embodiments, compensation patterns define one or more axes that are at acute, obtuse, or other angles.

FIG. 3 illustrates an exemplary fiducial 303 that includes linear portions 305, 307 that intersect at a corner 309. As shown in FIG. 3, the intersection of the linear portions 305, 307 forms an angle 310 that can be a right angle or other angle, such as an acute or obtuse angle.

As shown in FIG. 3, the angle 310 is a right angle and the linear portions 305, 307 extend along respective orthogonal axes 311, 313.

The linear portions 305, 307 include respective compensation patterns 315, 317 and 319, 321. Each of the compensation patterns 315, 317, 319, 321 is provided with respective alignment edges 315a–315c, 317a–317c, 319a–319c, and 321a–321c that are approximately parallel to the corresponding axis but displaced from the axis. For example, the alignment edges 315b, 315c and 317b, 317c are displaced by distances $d_{step}$, $2d_{step}$, respectively, from the alignment edges 315a, 317a, respectively, wherein $d_{step}$ is a compensation step distance $d_{step}$. The alignment edges 319b, 319c and 321a, 321c are similarly displaced from the alignment edge 317a. The alignment edges 319b, 319c and 321b, 321c are similarly displaced with respect to respective alignment edges 319a, 321a.

As shown in FIG. 3, the alignment edges 315a, 317a define the axis 311 and the alignment edges 319a, 321a define the axis 313. Reference lines 331, 333 are offset by distances D1, D2 respectively, from respective axes 311, 313 and can be used as positional reference lines for sawing or other operations.

As shown in shown in FIG. 3, the alignment edges 315a–315c, 317a–317c, 319a–319c, 321a–321c are, in this example, uniformly spaced based on a fixed compensation step distance $d_{step}$, but in other embodiments, $d_{step}$ can be different for each alignment region and the alignment edges of a selected alignment recent can have a non-uniform spacing. A more desirable performance is generally obtained if corresponding etch-compensation steps provide the same displacement. For example, steps that displace surfaces 315c and 317c are preferably equal.

With reference to FIG. 4, another embodiment of a fiducial pattern 401 includes lines or patterns 403a, 403b, 403c and lines 405a, 405b, 405c that comprise pairs (403a, 405a), (403b, 405b), and (403c, 405c) of complementary lines. If the fiducial pattern is transferred to a substrate without any noticeable process error, ends 407b, 409b of lines 403b, 405b, respectively, define an axis 411. If the fiducial pattern 401 is transferred to a substrate and exhibits a process error such as under etching or overetching, respective ends (407c, 409c), (407a, 409a) of the pairs (403c, 405c), (403a, 405a) can be used to define the axis 411.

With reference to FIG. 5, another fiducial pattern 501 includes pairs (503a, 505a), (503b, 505b), and (503c, 505c) of complementary lines or strips. If the fiducial pattern 501 is transferred to a substrate without any noticeable process error, ends 507b, 509b of strips 503b, 505b, respectively, define an axis 511. If the fiducial pattern 501 is transferred to a substrate and exhibits a process error such as underetching or overetching, respective ends (509c, 507c), (509a, 507a) or the pairs (503c, 505c), (503a, 505a) can be used to define the axis 511.

Having illustrated the described principles and features of the invention with reference to several embodiments, it will be apparent that these embodiments can be modified without departing from the spirit and scope of these principles. For example, the invention is not limited to the specifically illustrated exemplary fiducial patterns.

I claim:

1. A substrate comprising a fiducial that includes a first pair and a second pair of complementary features, each pair defining a common axis, wherein the common axis defines a process reference line.

2. A substrate, comprising a fiducial that includes an etch compensation pattern, wherein the etch compensation pattern includes an under-etch compensation portion.

3. The substrate of claim 2, wherein the etch compensation pattern includes an over-etch compensation portion.

4. A fiducial pattern for defining a fiducial on a substrate, the fiducial pattern comprising an etch compensation pattern, wherein the etch compensation pattern includes an under-etch compensation portion.

5. A fiducial pattern for defining a fiducial on a substrate, the fiducial pattern comprising an etch compensation pattern, wherein the etch compensation pattern includes both an under-etch compensation portion and an over-etch compensation portion.

6. A fiducial pattern for defining a fiducial on a substrate, the fiducial pattern comprising an etch compensation pattern that includes at least two pairs of complementary features, wherein the complementary features are edges.

7. A fiducial pattern for defining a fiducial on a substrate, the fiducial pattern comprising an etch compensation pattern that includes at least two pairs of complementary features, wherein the complementary features are ends of strips.

8. An etch gauge for determining an etch amount, the etch gauge comprising at least one first pair and at least one second pair of pattern features, the features of the first pair and of the second pair being situated equidistant from a first axis, and a third pair and a fourth pair of pattern features, the features of the third pair and of the fourth pair being situated equidistant from a second axis which intersects the first axis.

9. The etch gauge of claim 8, wherein the first axis and the second axis are orthogonal.

* * * * *